US011815312B2

(12) United States Patent
Li et al.

(10) Patent No.: US 11,815,312 B2
(45) Date of Patent: Nov. 14, 2023

(54) RAPID THERMAL PROCESSING METHOD AND RAPID THERMAL PROCESSING DEVICE

(71) Applicant: CHANGXIN MEMORY TECHNOLOGIES, INC., Hefei (CN)

(72) Inventors: Wei Li, Hefei (CN); Taoyan Yan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/828,431

(22) Filed: May 31, 2022

(65) Prior Publication Data

US 2023/0235960 A1 Jul. 27, 2023

(30) Foreign Application Priority Data

Jan. 21, 2022 (CN) ........................ 202210072936.X

(51) Int. Cl.

| | |
|---|---|
| ***H01L 21/67*** | (2006.01) |
| ***F27B 17/00*** | (2006.01) |
| ***F27B 9/40*** | (2006.01) |
| ***F27B 9/16*** | (2006.01) |
| ***F27B 9/12*** | (2006.01) |
| ***F27B 9/04*** | (2006.01) |

(Continued)

(52) U.S. Cl.

CPC ................ *F27B 9/40* (2013.01); *F27B 9/045* (2013.01); *F27B 9/12* (2013.01); *F27B 9/16* (2013.01); *F27B 9/3005* (2013.01); *F27B 17/0025* (2013.01); *F27D 19/00* (2013.01); *F27B 2009/124* (2013.01); *F27D 2019/0018* (2013.01); *F27D 2019/0059* (2013.01)

(58) Field of Classification Search

CPC ...... H01L 21/67248; F27B 9/40; F27B 9/045; F27B 9/12; F27B 9/16; F27B 9/3005; F27B 17/0025; F27D 19/00

See application file for complete search history.

(56) References Cited

U.S. PATENT DOCUMENTS 7,321,722 B2 * 1/2008 Tsai .................. H01L 21/67248 118/724

7,393,797 B2 * 7/2008 Tsai .................. H01L 21/67115 392/416

(Continued)

FOREIGN PATENT DOCUMENTS

CN 100472734 C 3/2009

KR 20060074499 A * 7/2006

*Primary Examiner* — Gregory A Wilson

(74) *Attorney, Agent, or Firm* — Cooper Legal Group, LLC

(57) ABSTRACT

A rapid thermal processing method and a rapid thermal processing device are provided. The rapid thermal processing method includes the following operations. A wafer is provided. A first heating operation is performed on the wafer to heat the wafer to a first temperature. The wafer is controlled to start rotating. The first temperature is maintained for a first predetermined time. A second heating operation is performed on the wafer to heat the wafer from the first temperature to a second temperature, and the second temperature is maintained for a second predetermined time. A third heating operation is performed on the wafer to heat the wafer from the second temperature to a third temperature, and the third temperature is maintained for a third predetermined time.

15 Claims, 4 Drawing Sheets

(51) Int. Cl.
*F27D 19/00* (2006.01)
*F27B 9/30* (2006.01)

(56) References Cited

U.S. PATENT DOCUMENTS

| | | | | |
|---|---|---|---|---|
| 7,732,352 | B2 * | 6/2010 | Mun | H01L 21/3225 117/2 |
| 2006/0030165 | A1 * | 2/2006 | Ingle | H01L 21/02271 257/E21.546 |
| 2013/0344688 | A1 * | 12/2013 | Ye | C23C 16/45525 438/486 |

* cited by examiner

RAPID THERMAL PROCESSING METHOD AND RAPID THERMAL PROCESSING DEVICE

CROSS-REFERENCE TO RELATED APPLICATION

The present application is based upon and claims priority to Chinese Patent Application No. 202210072936.X, filed on Jan. 21, 2022 and entitled "RAPID THERMAL PROCESSING METHOD AND DEVICE", the contents of which are incorporated herein by reference in its entirety.

TECHNICAL FIELD

The disclosure relates to the technical field of semiconductor device manufacturing, in particular to a rapid thermal processing method and a rapid thermal processing device.

BACKGROUND

During the manufacturing of semiconductor devices, a Rapid Thermal Processing (RTP) process is used to rapidly and uniformly heat a wafer, which is usually used for dopant activation and diffusion after ion implantation, performing tempering treatment with the gate oxide layer after formation of the metal suicide. However, the RTP process may also have an influence on the wafer, causing the wafer to be bent.

SUMMARY

In view of this, embodiments of the disclosure provide a rapid thermal processing method and a rapid thermal processing device.

According to a first aspect of the embodiments of the disclosure, a rapid thermal processing method is provided, which includes the following operations.

A wafer is provided.

A first heating operation is performed on the wafer to heat the wafer to a first temperature.

The wafer is controlled to start rotating.

The first temperature is maintained for a first predetermined time.

A second heating operation is performed on the wafer to heat the wafer from the first temperature to a second temperature, and the second temperature is maintained for a second predetermined time.

A third heating operation is performed on the wafer to heat the wafer from the second temperature to a third temperature, and the third temperature is maintained for a third predetermined time.

According to a second aspect of the embodiments of the disclosure, a rapid thermal processing device is provided, which includes:

- a carrier platform configured for placing a wafer;
- a heating device arranged below the carrier platform and configured to: perform a first heating operation on the wafer to heat the wafer to a first temperature and maintain the first temperature for a first predetermined time, perform a second heating operation on the wafer to heat the wafer from the first temperature to a second temperature and maintain the second temperature for a second predetermined time, and perform a third heating operation on the wafer to heat the wafer from the second temperature to a third temperature and maintain the third temperature for a third predetermined time; and
- a rotating device configured to control the wafer to start rotating when the wafer is heated to the first temperature.

BRIEF DESCRIPTION OF THE DRAWINGS

In order to describe the technical solutions in the embodiments of the disclosure or the conventional art more clearly, the accompanying drawings required to be used in the embodiments will be simply introduced below. Apparently, the accompanying drawings in the following description show merely some embodiments of the disclosure, and persons of ordinary skill in the art may still derive other drawings from these accompanying drawings without creative effort.

DESCRIPTION OF REFERENCE NUMERALS

Figure 1:
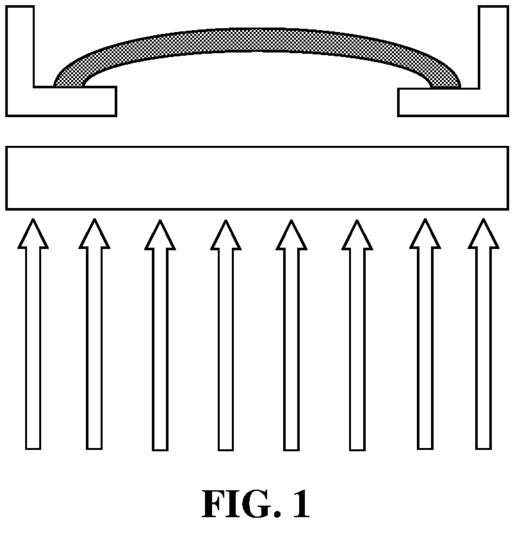
FIG. 1 is a schematic diagram showing upward bending of a wafer in some embodiments.

10—Wafer; 20—Carrier platform; 30—Heating device; 40—Gas introduction device.

DETAILED DESCRIPTION

Exemplary embodiments of the disclosure will be described in more detail below with reference to the accompanying drawings. Although the exemplary embodiments of the disclosure are shown in the accompanying drawings, it should be understood that the disclosure can be implemented in various forms and cannot be limited by the embodiments illustrated herein. On the contrary, these embodiments are provided to more thoroughly understand the disclosure and to completely convey the scope of the disclosure to those skilled in the art.

In the following description, numerous specific details are set forth in order to provide a more thorough understanding of the disclosure. However, it will be apparent to those skilled in the art that the disclosure can be implemented without one or more of these details. In other examples, in order to avoid confusion with the disclosure, some technical features known in the art are not described. That is, all the features of the actual embodiments are not described here, and the well-known functions and structures are not described in detail.

In the accompanying drawings, the sizes and relative size of layers, regions, and elements may be exaggerated for clarity. The same reference numerals denote the same elements from beginning to end.

It should be understood that, when an element or layer is described as being "on", "adjacent to", "connected to" or "coupled to" another element or layer, it can be directly on, adjacent to, connected to, or coupled to the other element or layer, or there can be an intermediate element or layer. In contrast, when an element is described as being "directly on", "directly adjacent to", "directly connected to" or "directly coupled to" another element or layer, there are no intermediate element or layer. It should be understood that although the terms "first", "second", "third" and so on may be used to describe various elements, components, regions, layers, and/or portions, these elements, components, regions, layers, and/or portions should not be limited by these terms. These terms are used merely to distinguish an element, component, region, layer, or portion from another element, component, region, layer, or portion. Therefore, a first element, component, region, layer, or portion discussed below may be described as a second element, component, region, layer, or portion without departing from the teachings of the present disclosure. When the second element, component, region, layer or portion is discussed, it does not mean that the first element, component, region, layer or portion is necessarily present in the present disclosure.

Spatial relation terms such as "below", "under", "lower", "beneath", "above", and "on" may be used herein for convenience of description to describe a relationship between an element or feature and another element or feature illustrated in the figures. It should be understood that, in addition to the orientations shown in the figures, the spatial relation terms are intended to include different orientations of devices in use and operation. For example, if the devices in the figures are turned over, then the element or feature described as "under" or "beneath" or "below" another element or feature would then be oriented as "above" the other element or feature. Therefore, the exemplary terms "under" and "below" may include both orientations of above and below. The device may be otherwise oriented (rotated by 90 degrees or in other orientations) and the spatial descriptions used herein may be interpreted accordingly.

Terms used herein are for the purpose of describing specific embodiments only and are not intended to be limiting of the present application. As used herein, "a/an", "one", and "the" in singular forms are also intended to include a plural form unless the context clearly indicates other forms. It should also be understood that the terms "consist" and/or "include" when used in the description, determine presence of the features, integers, steps, operations, elements, and/or components, but do not exclude the presence or addition of one or more other features, integers, steps, operations, elements, components, and/or groups. As used herein, the term "and/or" includes any and all combinations of the related listed items.

In order to thoroughly understand the disclosure, detailed steps and detailed structures will be presented in the following description to explain the technical solution of the disclosure. Preferred embodiments of the disclosure are described in details below. However, in addition to these detailed descriptions, and the disclosure may have other implementations.

In some embodiments, an RTP process has the effect of activating dopant ions or repairing lattice damage. Especially after ion implantation, RTP has more stringent requirements on the heating rate and time of the process. However, the wafer suffers from a greater load due to the higher heating rate. Specifically, as shown in FIG. 1, the wafer may be bent upwards to cause skipping of the wafer or even breakage, thereby reducing the life of the parts and increasing the production cost, which may adversely affect the subsequent process in severe cases.

Figure 2:
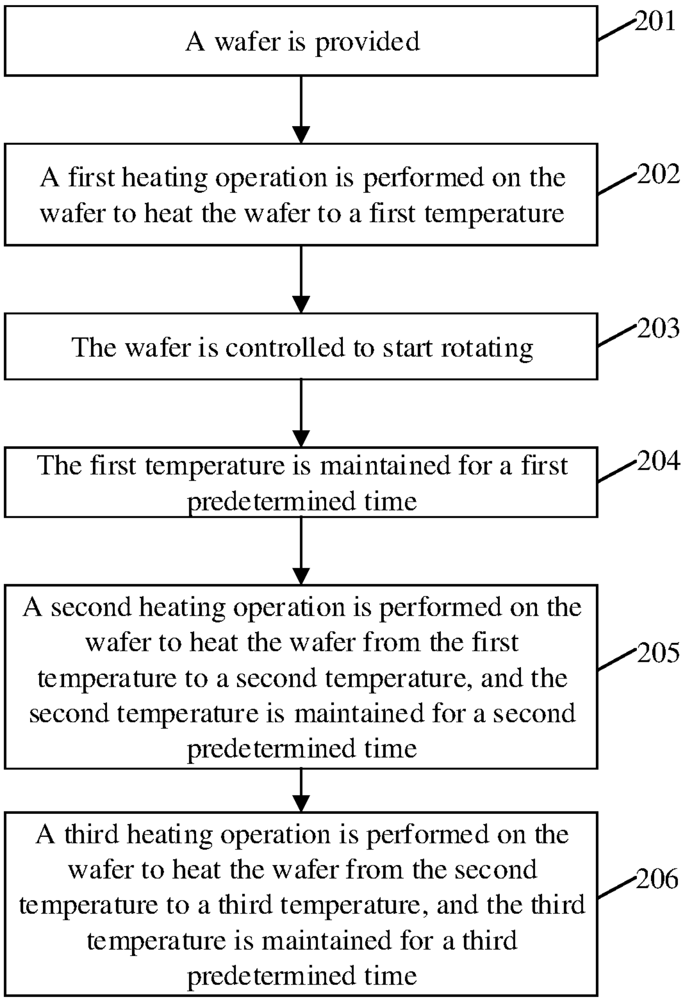
FIG. 2 is a flowchart of a rapid thermal processing method according to an embodiment of the disclosure.

An embodiment of the disclosure provides a rapid thermal processing method, which can specifically be seen in FIG. 2. As shown in this figure, the rapid thermal processing method includes the following operations.

In operation 201, a wafer is provided.

In operation 202, a first heating operation is performed on the wafer to heat the wafer to a first temperature.

In operation 203, the wafer is controlled to start rotating.

In operation 204, the first temperature is maintained for a first predetermined time.

In operation 205, a second heating operation is performed on the wafer to heat the wafer from the first temperature to a second temperature, and the second temperature is maintained for a second predetermined time.

In operation 206, a third heating operation is performed on the wafer to heat the wafer from the second temperature to a third temperature, and the third temperature is maintained for a third predetermined time.

In the embodiments of the disclosure, in a rapid thermal processing process, the temperature increasing process of a wafer is divided into three stages. After reaching the temperature at each stage, a certain time is maintained to allow a buffer time for the temperature increasing process of the wafer, so as to ensure that the structure of the wafer is more stable and prevent the wafer from being bent upwards. Meanwhile, the wafer is also rotated, so that the possibility of skipping of the wafer caused by upward bending of the wafer is further reduced through centrifugal force and the gravity of the wafer.

The rapid thermal processing method provided by the embodiments of the disclosure is described in further detail below in conjunction with specific embodiments.

Figure 3:
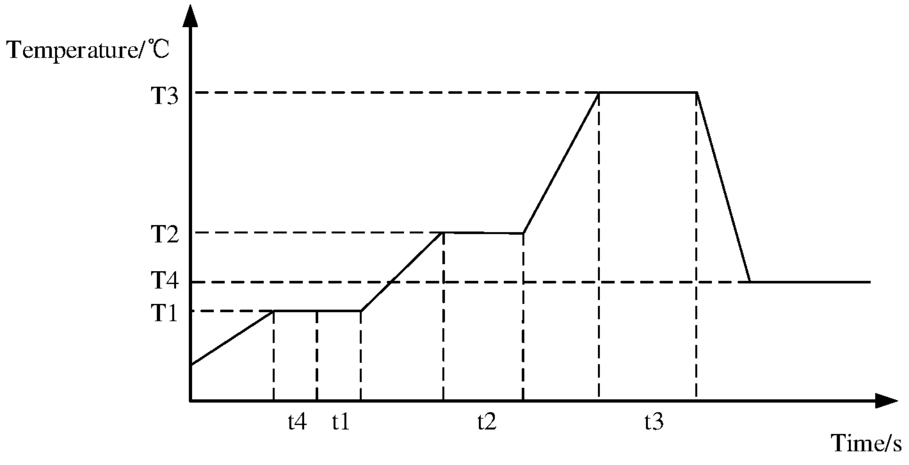
FIG. 3 is a graph showing a processing process of a rapid thermal processing method according to an embodiment of the disclosure.
Figure 4A:
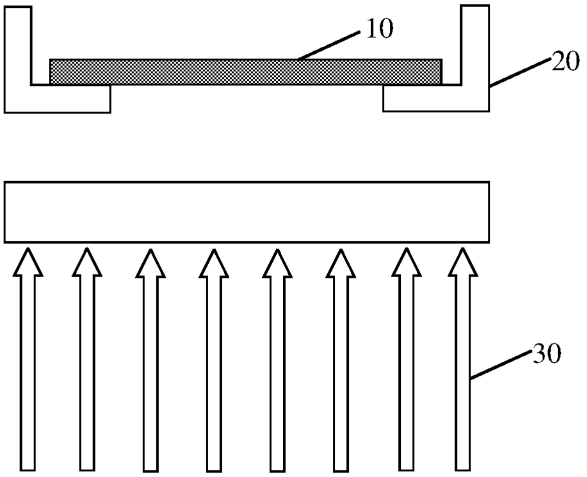
FIG. 4A to FIG. 4C are schematic diagrams showing structures in a processing process of a rapid thermal processing method according to an embodiment of the disclosure.
Figure 4B:
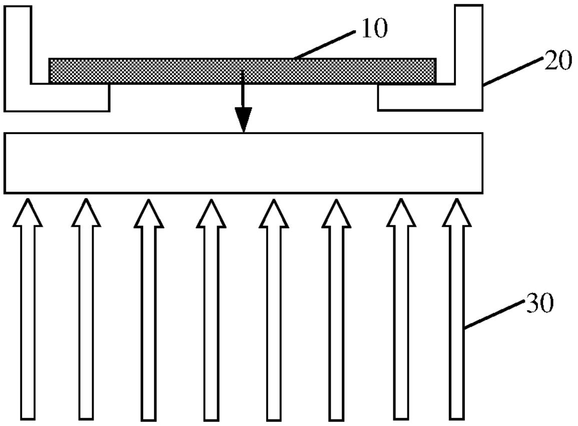
Figure 4C:
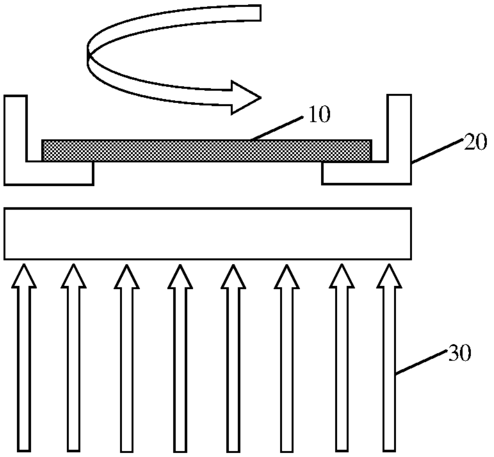

FIG. 3 is a graph showing a processing process of a rapid thermal processing method according to an embodiment of the disclosure. FIG. 4A to FIG. 4C are schematic diagrams showing structures in a processing process of a rapid thermal processing method according to an embodiment of the disclosure.

Firstly, referring to FIG. 4A, the operation 201 is executed to provide a wafer 10.

In an embodiment, the wafer 10 may be any wafer made of semiconductor materials, such as silicon wafers, sapphire wafers, and silicon carbide wafers. The wafer in the embodiment of the disclosure may be a silicon wafer, for example, the silicon wafer with any suitable semiconductor substrate application size, such as 2, 4, 6, 8, or 12 inches.

The wafer 10 is placed on a carrier platform 20.

Next, the operation 202 is executed to perform a first heating operation on the wafer 10, so as to heat the wafer 10 to a first temperature. Referring to FIG. 3, the first temperature is T1 shown in the figure.

In an embodiment, the first temperature T1 ranges from 150 to 200° C.

The wafer 10 may be heated to the first temperature T1 through Open Loop Tuning.

In an embodiment, the wafer 10 may be heated by a heating device 30.

Specifically, the heating device 30 may be a halogen lamp.

In an embodiment, the operation that the wafer 10 is provided includes the following operations. The wafer 10 is placed on a carrier platform 20. The carrier platform 20 is annular. The wafer 10 includes a peripheral area in contact with the carrier platform 20 and an internal area exposed from a middle portion of the annular carrier platform 20.

That is, the internal area is not in contact with the carrier platform 20. The heating operations are performed by using the heating device 30. The heating device 30 is arranged below the carrier platform 20, and includes a plurality of heating units. A heating temperature of the heating unit arranged below the internal area of the wafer 10 is greater than a heating temperature of the heating unit arranged below the peripheral area of the wafer 10.

The peripheral area of the wafer is in contact with the carrier platform. The material of the carrier platform is rubber with good heat absorption. However, the internal area of the wafer which is not in contact with the carrier platform conducts heat through air, which has poorer heat absorption compared to rubber. Therefore, the heating temperature below the area of the wafer which is in contact with the carrier platform is lower than the heating temperature below the internal area of the wafer which is not in contact with the carrier platform, so that the overall temperature of the wafer can be balanced, and the surface of the wafer can be heated more uniformly, thereby reducing the possibility of warpage or damage of the wafer caused by temperature imbalance.

Next, referring to FIG. 4B, after the wafer 10 is heated to the first temperature T1 and before the wafer 10 is controlled to start rotating, the method further includes the following operation. The first temperature T1 is maintained for a fourth predetermined time, and the wafer 10 is moved towards the heating device 30 during the fourth predetermined time. Referring to FIG. 3, the fourth predetermined time is t4 shown in the figure.

In an embodiment, the fourth predetermined time t4 ranges from 5 to 20 s.

After the wafer 10 is heated to the first temperature T1, the wafer 10 needs to be heated to a higher temperature. Therefore, the wafer 10 needs to be moved towards the heating device 30, so that the wafer is closer to the heating device 30. Thus, during heating to a higher temperature, the proximity to the heating device 30 allows the heating rate of the wafer 10 to be approximate to the heating rate of the heating device, thereby reducing heat loss and lowering cost.

In specific operation, the wafer 10 placed on the carrier platform 20 is moved by moving the carrier platform 20 towards the heating device 30.

Next, referring to FIG. 4C, the operation 203 is executed to control the wafer 10 to start rotating.

Specifically, the wafer 10 is rotated by a rotating device (not shown in the figure).

A rotation speed of the wafer 10 is 100-300 rpm/min. The rotation speed of the wafer 10 within this range can better reduce the possibility of upward bending of the wafer 10, while not causing the wafer 10 to be bent downwards due to the excessive rotation speed.

Next, the operation 204 is executed to maintain the first temperature T1 for a first predetermined time. Referring to FIG. 3, the first predetermined time is t1 shown in the figure.

In an embodiment, the first predetermined time t1 ranges from 5 to 20 s.

In an embodiment, the method further includes the following operation. An inert gas is introduced during the fourth predetermined time t4 and the first predetermined time t1 for which the first temperature T1 is maintained.

A gas flow rate of the inert gas is 50-150 slm, and the inert gas includes at least one of nitrogen, argon or helium.

Figure 5:
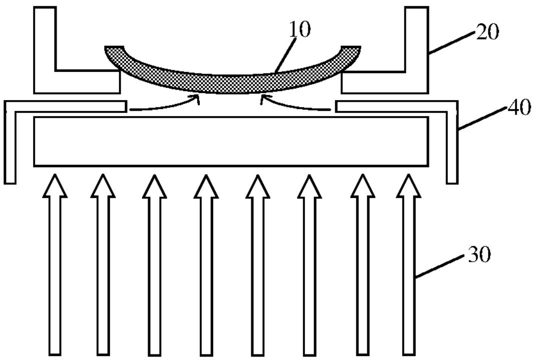
FIG. 5 is a schematic diagram showing downward bending of a wafer in an embodiment of the disclosure.

FIG. 5 is a schematic diagram showing downward bending of a wafer in an embodiment of the disclosure. In a process of the movement of the wafer 10 towards the heating device 30 during the fourth predetermined time t4, the wafer 10 may be bent downwards. As shown in FIG. 5, the downward bending of the wafer may cause friction between the wafer and the parts at the bottom, which may cause damage to the wafer and shorten the life of the parts. Therefore, when the wafer 10 is moved towards the heating device 30, the inert gas needs to be introduced to prevent the wafer 10 from being bent downwards.

The inert gas may be introduced under the wafer 10 through a gas introduction device 40.

Figure 6:
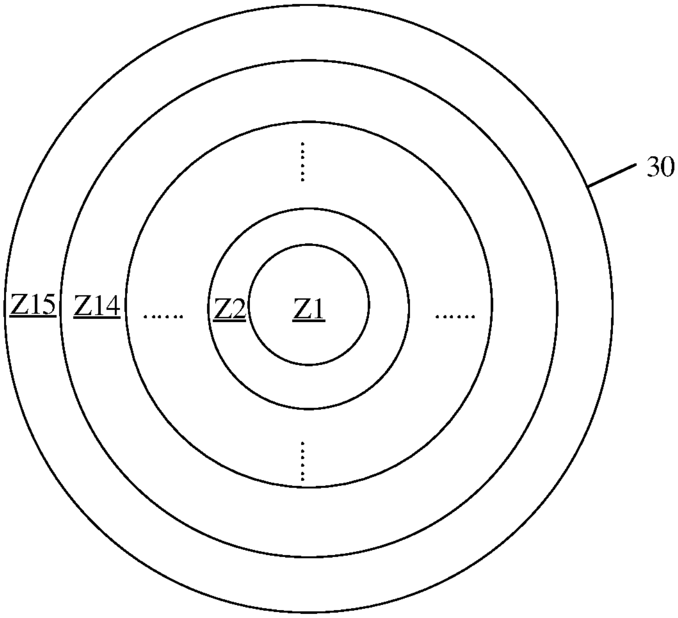
FIG. 6 is a schematic diagram of a heating device in an embodiment of the disclosure.

In a specific embodiment, as shown in FIG. 6, the heating device 30 includes 15 heating units, which are sequentially divided into the first heating unit to the fifteenth heating unit, respectively referred to as Z1 to Z15, from the center to the periphery of the heating device 30.

During the fourth predetermined time t4 and the first predetermined time t1 for which the first temperature T1 is maintained, the heating power of the first heating unit Z1 ranges from 400 to 800 W, the heating powers of the second heating unit Z2 to the sixth heating unit Z6 range from 1000 to 1400 W, the heating powers of the eighth heating unit Z8 to the twelfth heating unit Z12 range from 400 to 800 W, and the heating powers of the thirteenth heating unit Z13 to the fifteenth heating unit Z15 range from 0 to 700 W. The range of the heating power of the seventh heating unit Z7 during the fourth predetermined time t4 is different from that during the first predetermined time t1. The heating power of the seventh heating unit Z7 ranges from 1100 to 1300 W during the fourth predetermined time t4, and the heating power of the seventh heating unit Z7 ranges from 400 to 800 W during the first predetermined time t1.

Next, the operation 205 is executed to perform a second heating operation on the wafer 10, so as to heat the wafer 10 from the first temperature to a second temperature, and maintain the second temperature for a second predetermined time. Referring to FIG. 3, the second temperature is T2 shown in the figure, and the second predetermined time is t2 shown in the figure.

In an embodiment, the second temperature T2 ranges from 450 to 650° C., and the second predetermined time t2 ranges from 10 to 20 s.

Next, the operation 206 is executed to perform a third heating operation on the wafer 10, so as to heat the wafer 10 from the second temperature to a third temperature, and maintain the third temperature for a third predetermined time. Referring to FIG. 3, the third temperature is T3 shown in the figure, and the third predetermined time is t3 shown in the figure.

In an embodiment, the third temperature T3 ranges from 800 to 1100° C., and the third predetermined time t3 ranges from 5 to 60 s.

In an embodiment, a heating rate at which the wafer 10 is heated to the first temperature T1 is a first rate, a heating rate at which the wafer 10 is heated from the first temperature T1 to the second temperature T2 is a second rate, and a heating rate at which the wafer 10 is heated from the second temperature T2 to the third temperature T3 is a third rate. The first rate, the second rate and the third rate gradually increase.

The first rate ranges from 15 to 30° C./s, the second rate ranges from 40 to 80° C./s, and the third rate ranges from 100 to 250° C./s.

Next, the method further includes the following operation. After the third temperature T3 of the wafer 10 is maintained for the third predetermined time t3, the wafer 10 is cooled to a fourth temperature, and the rotation of the wafer 10 is stopped. Referring to FIG. 3, the fourth temperature is T4 shown in the figure.

In an embodiment, the fourth temperature T4 ranges from 350 to 550° C.

A rate at which the wafer 10 is cooled from the third temperature T3 to the fourth temperature T4 is a fourth rate, and the fourth rate ranges from 50 to 100° C./s.

The wafer 10 is rotated from the process in which the wafer 10 is heated to the first temperature T1 to the process in which the wafer 10 is cooled to the fourth temperature T4, thereby facilitating reducing the possibility of skipping of the wafer caused by the upward bending of the wafer through centrifugal force and the gravity of the wafer throughout the RTP process.

Figure 7:
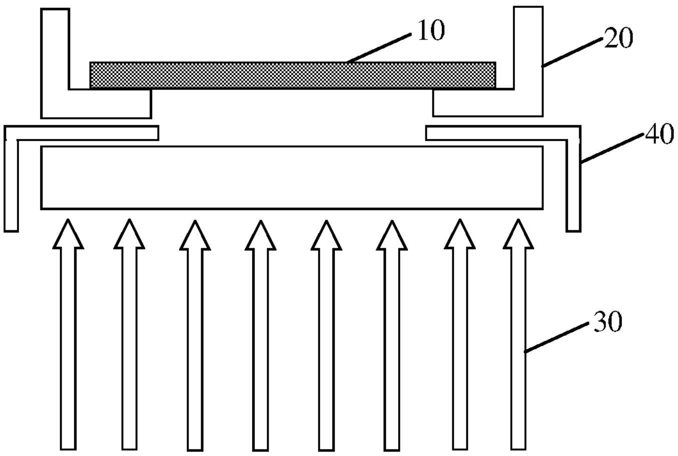
FIG. 7 is a schematic diagram of a rapid thermal processing device according to an embodiment of the disclosure.

An embodiment of the disclosure provides a rapid thermal processing device. FIG. 7 is a schematic diagram of a rapid thermal processing device according to an embodiment of the disclosure.

As shown in FIG. 7, the rapid thermal processing device includes:

a carrier platform 20 configured for placing a wafer 10; a heating device 30 arranged below the carrier platform 20 and configured to: perform a first heating operation on the wafer 10 to heat the wafer 10 to a first temperature and maintain the first temperature for a first predetermined time, perform a second heating operation on the wafer 10 to heat the wafer 10 from the first temperature to a second temperature and maintain the second temperature for a second predetermined time, and perform a third heating operation on the wafer 10 to heat the wafer 10 from the second temperature to a third temperature and maintain the third temperature for a third predetermined time; and a rotating device (not shown in the figure) configured to control the wafer 10 to start rotating when the wafer 10 is heated to the first temperature.

In an embodiment, the wafer 10 may be any wafer made of semiconductor materials, such as silicon wafers, sapphire wafers, and silicon carbide wafers. The wafer in the embodiment of the disclosure may be a silicon wafer, for example, the silicon wafer with any suitable semiconductor substrate application size, such as 2, 4, 6, 8, or 12 inches.

Referring to FIG. 3, the first temperature is T1 shown in the figure, the first predetermined time is t1 shown in the figure, the second temperature is T2 shown in the figure, the second predetermined time is t2 shown in the figure, the third temperature is T3 shown in the figure, and the third predetermined time is t3 shown in the figure.

In an embodiment, the first temperature T1 ranges from 150 to 200° C., the second temperature T2 ranges from 450 to 650° C., and the third temperature T3 ranges from 800 to 1100° C.

In an embodiment, the first predetermined time t1 ranges from 5 to 20 s, the second predetermined time t2 ranges from 10 to 20 s, and the third predetermined time t3 ranges from 5 to 60 s.

In a specific embodiment, the heating device 30 may be a halogen lamp.

In an embodiment, a heating rate at which the wafer 10 is heated to the first temperature T1 is a first rate, a heating rate at which the wafer 10 is heated from the first temperature T1 to the second temperature T2 is a second rate, and a heating rate at which the wafer 10 is heated from the second temperature T2 to the third temperature T3 is a third rate. The first rate, the second rate and the third rate gradually increase.

The first rate ranges from 15 to 30° C./s, the second rate ranges from 40 to 80° C./s, and the third rate ranges from 100 to 250° C./s.

In an embodiment, the carrier platform 20 is annular. The wafer 10 includes a peripheral area in contact with the carrier platform 20 and an internal area exposed from a middle portion of the annular carrier platform 20. The heating device 30 is arranged below the carrier platform 20, and the heating device 30 includes a plurality of heating units. A heating temperature of the heating unit arranged below the internal area of the wafer 10 is greater than a heating temperature of the heating unit arranged below the peripheral area of the wafer 10.

The peripheral area of the wafer is in contact with the carrier platform. The material of the carrier platform is rubber with good heat absorption. However, the internal area of the wafer which is not in contact with the carrier platform conducts heat through air, which has poorer heat absorption compared to rubber. Therefore, the heating temperature below the area of the wafer which is in contact with the carrier platform is lower than the heating temperature below the internal area of the wafer which is not in contact with the carrier platform, so that the overall temperature of the wafer can be balanced, and the surface of the wafer can be heated more uniformly, thereby reducing the possibility of warpage or damage of the wafer caused by temperature imbalance.

In an embodiment, a rotation speed of the wafer 10 is 100-300 rpm/min. The rotation speed of the wafer 10 within this range can better reduce the possibility of upward bending of the wafer 10, while not causing the wafer 10 to be bent downwards due to the excessive rotation speed.

In an embodiment, the heating device 30 is further configured to maintain, before the wafer 10 is controlled to start rotating, the first temperature for a fourth predetermined time. The rapid thermal processing device further includes a driving device (not shown in the figure), which is configured to move the wafer towards the heating device during the fourth predetermined time.

Referring to FIG. 3, the fourth predetermined time is t4 shown in the figure. In an embodiment, the fourth predetermined time t4 ranges from 5 to 20 s.

After the wafer 10 is heated to the first temperature T1, the wafer 10 needs to be heated to a higher temperature. Therefore, the wafer 10 needs to be moved towards the heating device 30, so that the wafer is closer to the heating device 30. Thus, during heating to a higher temperature, the proximity to the heating device 30 allows the heating rate of the wafer 10 to be approximate to the heating rate of the heating device, thereby reducing heat loss and lowering cost.

In specific operation, the wafer 10 placed on the carrier platform 20 is moved by moving the carrier platform 20 towards the heating device 30.

In an embodiment, the rapid thermal processing device further includes a gas introduction device 40, which is configured to introduce an inert gas during the fourth predetermined time t4 and the first predetermined time t1 for which the first temperature T1 is maintained.

A gas flow rate of the inert gas is 50-150 slm, and the inert gas includes at least one of nitrogen, argon or helium.

FIG. 5 is a schematic diagram showing downward bending of a wafer in an embodiment of the disclosure. In a process of the movement of the wafer 10 towards the heating device 30 during the fourth predetermined time t4, the wafer 10 may be bent downwards. As shown in FIG. 5, the downward bending of the wafer may cause friction between the wafer and the parts at the bottom, which may cause damage to the wafer and shorten the life of the parts. Therefore, when the wafer 10 is moved towards the heating device 30, the inert gas needs to be introduced to prevent the wafer 10 from being bent downwards.

The inert gas may be introduced under the wafer 10 through a gas introduction device 40.

In a specific embodiment, as shown in FIG. 6, the heating device 30 includes 15 heating units, which are sequentially divided into the first heating unit to the fifteenth heating unit, respectively referred to as Z1 to Z15, from the center to the periphery of the heating device 30.

During the fourth predetermined time t4 and the first predetermined time t1 for which the first temperature T1 is maintained, the heating power of the first heating unit Z1 ranges from 400 to 800 W, the heating powers of the second heating unit Z2 to the sixth heating unit Z6 range from 1000 to 1400 W, the heating powers of the eighth heating unit Z8 to the twelfth heating unit Z12 range from 400 to 800 W, and the heating powers of the thirteenth heating unit Z13 to the fifteenth heating unit Z15 range from 0 to 700 W. The range of the heating power of the seventh heating unit Z7 during the fourth predetermined time t4 is different from that during the first predetermined time t1. The heating power of the seventh heating unit Z7 ranges from 1100 to 1300 W during the fourth predetermined time t4, and the heating power of the seventh heating unit Z7 ranges from 400 to 800 W during the first predetermined time t1.

In an embodiment, the heating device 30 is further configured to cool, after the third temperature T3 of the wafer 10 is maintained for the third predetermined time t3, the wafer 10 to a fourth temperature. The rotating device is further configured to stop, after the wafer 10 is cooled to the fourth temperature, the rotation of the wafer 10.

Referring to FIG. 3, the fourth temperature is T4 shown in the figure. In an embodiment, the fourth temperature T4 ranges from 350 to 550° C.

A rate at which the wafer 10 is cooled from the third temperature T3 to the fourth temperature T4 is a fourth rate, and the fourth rate ranges from 50 to 100° C./s.

The wafer 10 is rotated from the process in which the wafer 10 is heated to the first temperature T1 to the process in which the wafer 10 is cooled to the fourth temperature T4, thereby facilitating reducing the possibility of skipping of the wafer caused by the upward bending of the wafer through centrifugal force and the gravity of the wafer throughout the RTP process.

The above only describes the preferred embodiments of the disclosure and is not intended to limit the protection scope of the disclosure. Any modifications, equivalent substitution, improvements made within the spirit and principle of the disclosure shall be contained within the protection scope of the disclosure.

The invention claimed is:

1. A rapid thermal processing method, comprising:
providing a wafer;
performing a first heating operation on the wafer to heat the wafer to a first temperature;
controlling the wafer to start rotating;
maintaining the first temperature for a first predetermined time;
performing a second heating operation on the wafer to heat the wafer from the first temperature to a second temperature, and maintaining the second temperature for a second predetermined time; and
performing a third heating operation on the wafer to heat the wafer from the second temperature to a third temperature, and maintaining the third temperature for a third predetermined time,
wherein after heating the wafer to the first temperature and before controlling the wafer to start rotating, the rapid thermal processing method further comprises:
maintaining the first temperature for a fourth predetermined time, and moving the wafer towards a heating device during the fourth predetermined time.

2. The rapid thermal processing method according to claim 1, wherein a rotation speed of the wafer is 100-300 revolutions per minute (rpm).

3. The rapid thermal processing method according to claim 1, wherein after maintaining the third temperature for the third predetermined time, the rapid thermal processing method further comprises:
cooling the wafer to a fourth temperature, and stopping rotation of the wafer.

4. The rapid thermal processing method according to claim 1, wherein the rapid thermal processing method further comprises:
introducing an inert gas during the fourth predetermined time and the first predetermined time for which the first temperature is maintained.

5. The rapid thermal processing method according to claim 4, wherein
a gas flow rate of the inert gas is 50-150 standard liters per minute (slm), and the inert gas comprises at least one of nitrogen, argon or helium.

6. The rapid thermal processing method according to claim 1, wherein
the first temperature ranges from 150 to 200° C., the second temperature ranges from 450 to 650° C., and the third temperature ranges from 800 to 1100° C.

7. The rapid thermal processing method according to claim 1, wherein
providing the wafer comprises placing the wafer on an annular carrier platform, the wafer comprising a peripheral area in contact with the annular carrier platform and an internal area exposed from a middle portion of the annular carrier platform; and
wherein the first heating operation, the second heating operation, and the third heating operation are performed by the heating device arranged below the annular carrier platform and comprising a plurality of heating components, wherein a heating temperature of one or more of the plurality of heating components arranged below the internal area of the wafer is greater than a heating temperature of one or more of the plurality of heating components arranged below the peripheral area of the wafer.

8. The rapid thermal processing method according to claim 1, wherein
the first predetermined time is 5-20 s, the second predetermined time is 10-20 s, and the third predetermined time is 5-60 s.

9. The rapid thermal processing method according to claim 1, wherein
a heating rate at which the wafer is heated to the first temperature is a first rate, a heating rate at which the wafer is heated from the first temperature to the second temperature is a second rate, and a heating rate at which the wafer is heated from the second temperature to the third temperature is a third rate, and wherein the first rate, the second rate and the third rate gradually increase.

10. The rapid thermal processing method according to claim 9, wherein
the first rate ranges from 15 to 30° C./s, the second rate ranges from 40 to 80° C./s, and the third rate ranges from 100 to 250° C./s.

11. A rapid thermal processing device, comprising:
a carrier platform configured for placing a wafer;

a heating device arranged below the carrier platform and configured to: perform a first heating operation on the wafer to heat the wafer to a first temperature and maintain the first temperature for a first predetermined time, perform a second heating operation on the wafer to heat the wafer from the first temperature to a second temperature and maintain the second temperature for a second predetermined time, and perform a third heating operation on the wafer to heat the wafer from the second temperature to a third temperature and maintain the third temperature for a third predetermined time; and a rotating device configured to control the wafer to start rotating when the wafer is heated to the first temperature, wherein the heating device is further configured to maintain the first temperature for a fourth predetermined time before the wafer is controlled to start rotating; and wherein the rapid thermal processing device further comprises a driving device configured to move the wafer towards the heating device during the fourth predetermined time.

12. The rapid thermal processing device according to claim 11, further comprising:

a gas introduction device configured to introduce an inert gas during the fourth predetermined time and the first predetermined time for which the first temperature is maintained.

13. The rapid thermal processing device according to claim 11, wherein the carrier platform is annular, and the wafer comprises a peripheral area in contact with the carrier platform and an internal area exposed from a middle portion of the carrier platform; and wherein the heating device is arranged below the carrier platform and comprises a plurality of heating components, wherein a heating temperature of one or more of the plurality of heating components arranged below the internal area of the wafer is greater than a heating temperature of one or more of the plurality of heating components arranged below the peripheral area of the wafer.

14. The rapid thermal processing device according to claim 11, wherein the heating device is further configured to cool the wafer to a fourth temperature after the third temperature of the wafer is maintained for the third predetermined time; and wherein the rotating device is further configured to stop rotation of the wafer after the wafer is cooled to the fourth temperature.

15. A rapid thermal processing method, comprising:

providing a wafer;

performing a first heating operation on the wafer to heat the wafer to a first temperature;

controlling the wafer to start rotating;

maintaining the first temperature for a first predetermined time;

performing a second heating operation on the wafer to heat the wafer from the first temperature to a second temperature, and maintaining the second temperature for a second predetermined time; and performing a third heating operation on the wafer to heat the wafer from the second temperature to a third temperature, and maintaining the third temperature for a third predetermined time, wherein providing the wafer comprises placing the wafer on an annular carrier platform, the wafer comprising a peripheral area in contact with the annular carrier platform and an internal area exposed from a middle portion of the annular carrier platform; and wherein the first heating operation, the second heating operation, and the third heating operation are performed by a heating device arranged below the annular carrier platform and comprising a plurality of heating components, wherein a heating temperature of one or more of the plurality of heating components arranged below the internal area of the wafer is greater than a heating temperature of one or more of the plurality of heating components arranged below the peripheral area of the wafer.

* * * * *